United States Patent
Debley et al.

(10) Patent No.: US 6,447,653 B1
(45) Date of Patent: Sep. 10, 2002

(54) METHOD OF SHAPING A FLUX MASK AND PROCESS OF SPUTTERING WITH THE SHAPED FLUX MASK

(75) Inventors: William Debley, Northridge; Leo Lam, Calabasas; Radhakrishna Mandyam, Agoura Hills; Dhirubhai Patel, West Hills, all of CA (US)

(73) Assignee: Litton Systems Inc., Woodland Hills, CA (US)

( * ) Notice: Subject to any disclaimer, the term of this patent is extended or adjusted under 35 U.S.C. 154(b) by 0 days.

(21) Appl. No.: 09/686,569

(22) Filed: Oct. 11, 2000

(51) Int. Cl.[7] ............................................. C23C 14/34
(52) U.S. Cl. .............................. 204/192.13; 204/192.11
(58) Field of Search ........................ 204/192.12, 192.11, 204/192.13, 192.15, 192.26

(56) References Cited

U.S. PATENT DOCUMENTS

| | | | | |
|---|---|---|---|---|
| 3,904,503 A | * | 9/1975 | Hanfmann | 204/192.12 |
| 4,142,958 A | | 3/1979 | Wei et al. | 204/192.11 |
| 4,315,960 A | * | 2/1982 | Ohji et al. | 204/298.11 |
| 4,416,760 A | * | 11/1983 | Turner | 204/298.11 |
| 4,848,909 A | | 7/1989 | Cole | 356/469 |
| 5,529,671 A | * | 6/1996 | Debley et al. | 204/192.11 |
| 6,063,436 A | * | 5/2000 | Pavell et al. | 204/192.11 |
| 6,200,431 B1 | * | 3/2001 | Sone et al. | 204/192.12 |

\* cited by examiner

*Primary Examiner*—Nam Nguyen
*Assistant Examiner*—Gregg Cantelmo
(74) *Attorney, Agent, or Firm*—Price and Gess

(57) ABSTRACT

The present invention provides a method for shaping a mask to reduce coating non-uniformity in the radial direction. A test run of the ion beam sputtering system coats a stationary glass plate having the same area and shape as the platen. The resulting coating thickness is measured across the surface of the glass plate and plotted as a function of position. This is the plot of the flux distribution. The coating rate pattern is determined by coating thickness by coating time. The desired width of the mask, which takes the form of a segment of a radial band is adjusted to obtain the desired average coating rate for the entire segment, masked and unmasked. This is repeated for each radial band. All these radial widths put together design the functional form of the mask, the use of which provides a uniform coating of the platen in a radial direction.

5 Claims, 2 Drawing Sheets

METHOD OF SHAPING A FLUX MASK AND PROCESS OF SPUTTERING WITH THE SHAPED FLUX MASK

BACKGROUND OF THE INVENTION

1. Field of the Invention

The present invention relates to a method for optical coating. More specifically, the present invention relates to a method for compensating for radial variations in the coating rate of substrates on a rotating platen.

2. Related Art

Mirrors are used in ring laser gyroscopes to reflect two counter propagating laser waves in a laser cavity. The mirrors are made on a glass substrate coated with oxide layers. Each oxide layer has a specific thickness designed to meet spectral or other dielectric requirements. The oxide layers coated on each mirror alternate between an oxide layer having a high index of refraction and an oxide layer having a low index of refraction. For example, titanium dioxide ($TiO_2$) is used for the high index oxide layers and silicon dioxide ($SiO_2$) is used for the low oxide index layers.

The oxide layers are coated on the mirrors using ion beam sputtering (IBS). The mirrors are placed on a platen under a target plate containing the oxide or metal to be sputtered to form the oxides on the mirror. An ion beam gun bombards the target plate with argon ions, which breakaway oxide molecules or metal atoms from the target plate. The metal atoms form oxides in an oxygen filled background in the vacuum chamber. The oxide molecules then coat the surface of the substrates on the platen.

A problem with IBS is that the flux of oxide molecules from the target plate is non-uniform, resulting in non-uniform coating of the mirrors. The flux pattern is usually characterized by a peak flux with the flux dropping off in a radial direction from the peak flux. The non-uniform coating of the mirror is undesirable in ring laser gyroscopes because it causes distortions in the laser wavefront.

A conventional method to reduce the non-uniformity in the coating uses planetary motion of the mirrors. The mirrors are arranged in concentric circular rows on substrate platens, which rotate on a main platen. During coating, the center of the main platen rotates while the substrate platens rotate on the main platen. This causes the mirrors to trace a double rotating pattern, which tends to average out the position of each mirror. This results in positional independence of the mirrors and coating uniformity.

A problem with the planetary motion method is that it requires rotating the mirrors about two platen axis, which drives up the cost of the coating apparatus. In addition, the planetary motion involves moving the mirrors over a wide area. To cover the wide area, the target plate has to be positioned farther away from the platens to widen the traverse extent (diameter) of the flux area. This reduces the flux, which decreases with 1/distance$^2$, where the distance is between the target plate and the platens. The reduction in the flux results in a reduction in the coating rate of the mirrors, thereby increasing the coating time of the mirrors.

Another method to reduce the non-uniformity in the coating is to rotate the mirrors about one platen axis. The mirrors are arranged in concentric circular rows on a platen. During coating, the platen rotates, which tends to average out the angular position of the mirrors with respect to the platen axis. This results in angular positional independence of the mirrors and coating uniformity in the angular direction. This method is more cost effective than the planetary motion method because the mirrors only rotate about one platen axis. In addition, the mirrors move over a smaller area compared to the planetary method, allowing the target plate to be positioned closer to the platen. This increases the flux and hence the coating rate of the mirrors.

A major problem with the single axis rotation method, however, is that it does not reduce the non-uniformity in the coating in the radial direction. In addition, positioning the target plate closer to the platen causes the flux pattern to drop off more rapidly from the peak flux, resulting in even greater non-uniformity in the radial direction.

Therefore, there is a need for a mirror coating method that reduces the non-uniformity of the coating in both the angular and radial direction, while still maintaining the cost effectiveness and high coating rate of the single axis rotation method.

SUMMARY OF THE INVENTION

The present invention provides a quick and easy method for a mask shape to reduce coating non-uniformity in the radial direction. A test run of the ion beam sputtering system coats a stationary glass plate having the same area and shape as the platen. The resulting coating thickness is measured across the surface of the glass plate and plotted as a function of position. This plot is the plot of the flux distribution. The coating rate pattern is determined by coating thickness by coating time. The desired width of the mask, which takes the form of a segment of a radial band, is adjusted to obtain the desired average coating rate for the entire segment, masked and unmasked. This is repeated for each radial band. All these radial widths put together design the functional form of the mask, the use of which provides a uniform coating of the platen in a radial direction.

BRIEF DESCRIPTION OF THE DRAWINGS

The exact nature of this invention will be readily apparent from consideration of the following detailed description in conjunction with the accompanying drawings, wherein.

DETAILED DESCRIPTION OF THE INVENTION

The following description is provided to enable any person skilled in the art to make and use the invention and sets forth the best modes contemplated by the inventors of carrying out their invention.

The coating method of the present invention is for an IBS coating apparatus comprising a target plate containing oxide and a platen below the target plate for holding mirrors to be coated with the oxide. The mirrors on the platen are arranged in concentric circular rows centered at the platen axis. During coating of the mirror, the platen is rotated to reduce non-uniformity in the coating in the angular direction with respect to the platen axis.

To reduce radial variation of the coating, the method of the present invention provides a mask, positioned between the target plate and the platen, for partially blocking the flux. The width of the mask varies in the radial direction to provide varying amounts of flux blockage in the radial direction. The radial variation in the flux blockage allows the mask to compensate for radial variations in the coating rate by providing more flux blockage for radial distances having a higher coating rate. That way, the radial variation in the flux blockage of the mask cancels out the original radial variation in the coating rate, resulting in a uniform coating of the mirrors.

Figure 4:
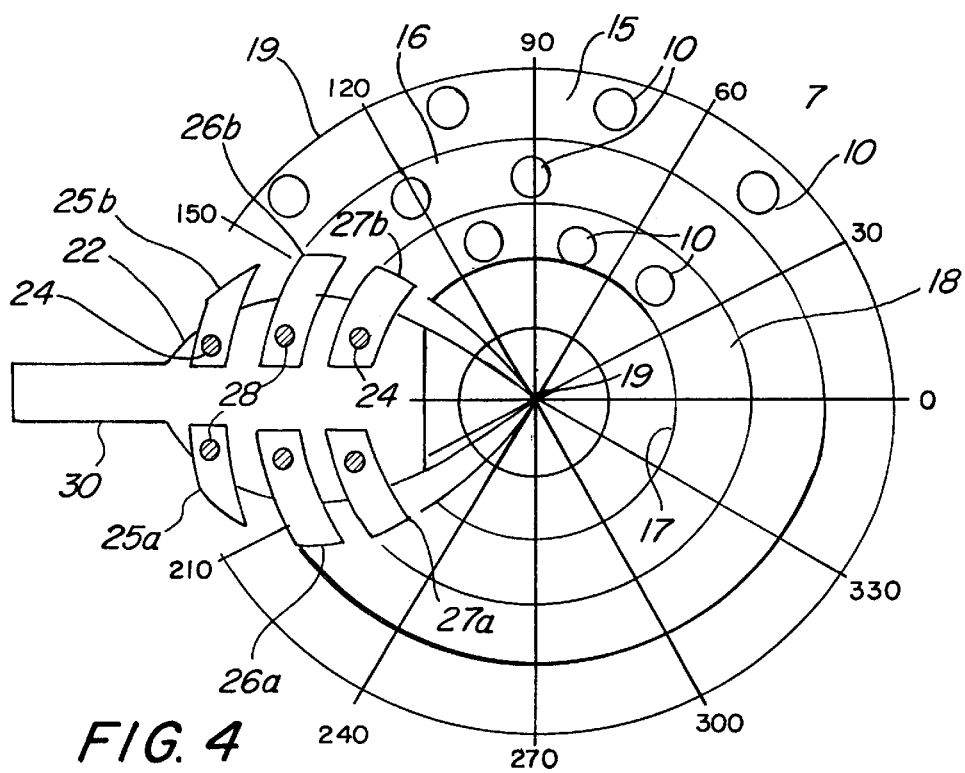
FIG. 4 is a top view schematic of a platen holding a substrate to be coated and a mask according to the present invention positioned over the substrate.

FIG. 4 shows a top view of a circular platen 7 having three concentric circular rows 15, 16 and 18 of mirrors 10 centered at the platen axis 19. Also shown is a symmetrical mask 22 positioned between the platen 7 and a target plate (not shown) being held in place over the platen 7 by an arm 30. The mask 22 extends in the radial direction from the inner circumference 17 of the innermost row 18 to the outer circumference 19 of the outermost row 15. The mask 22 is divided into three angular segments 25a,b, 26a,b and 27a,b, where each angular segment provides flux blockage for one of the rows 15, 16 and 18. Each of the angular segments 25, 26 and 27 are held to the arm 30 by mechanical fasteners 24 passing through slots 28 in each of the segments 25a,b, 26a,b and 27a,b. The flux blockage between the rows 15, 16 and 18 is adjustable with respect to the angular width and edge slope of the segments 25, 26 and 27 by sliding and tilting the individual segments 25a,b, 26a,b and 27a,b with respect to the arm 30. The angular width is adjusted by sliding the segments 25, 26 and 27 across the arm 30. The edge slopes are adjusted by changing the angle of the edge pieces.

Another method for adjusting the average angular width and edge slope of the segments 25, 26 and 27 is to replace the segments from a collection of segments with different angular widths and edge slopes.

Figure 1:
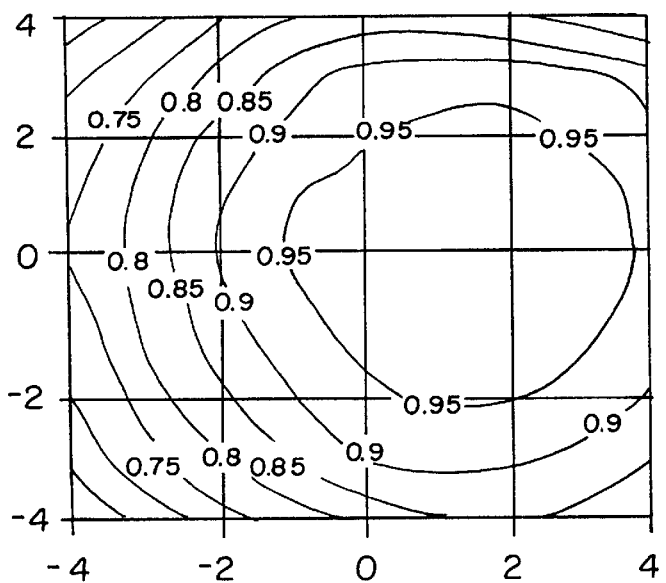
FIG. 1 shows a mapping of flux pattern on a substrate platen used to generate a mask according to the present invention.

A method for generating the mask will now be described with reference to FIGS. 1 and 2. The first step is to map the coating thickness on a large stationary glass plate covering the area of the platen. The glass plate is placed under the target plate and coated with an oxide layer having a conveniently measurable thickness. The coating time of the glass plate can be made much shorter than the coating time of the mirrors. After coating, an ellipsometer measures the coating thickness on the glass plate as a function of position. Using these measurements, a mapping of the coating thickness which corresponds to the flux pattern is made, as shown in FIG. 1. A mapping of the coating rate can then be made by dividing the mapping of the coating thickness by the coating time of the glass plate. In addition, the radial variation in the coating rate can be calculated by averaging the coating rate along circles on the mapping of the coating rate centered at the platen axis 19.

The angular width of the mask as a function of the radial distance from the platen axis 19 can then be found for a desired uniform coating rate. This is done by determining the angular width at several different radial distances resulting in the desired uniform coating rate, and then interpolating the angular width between the determined angular widths using a smoothing function. To produce a symmetrical mask, the angular widths are centered along a radial line from the platen axis 19. The radial line also determines the angular position of the mask with respect to the platen axis 19.

The angular width at a particular radial distance is determined by, first, finding the circle on the mapping of the coating rate corresponding to the radial distance. The coating rate as a function of the angular width is then found by blocking the portion of the circle subtended by the angular width and averaging the coating rate in the unblocked portion of the circle. The angular width resulting in the desired coating rate is then determined by adjusting the angular width until the desired coating rate is reached. The angular width at the other radial distances is determined in the same manner.

Figure 2:
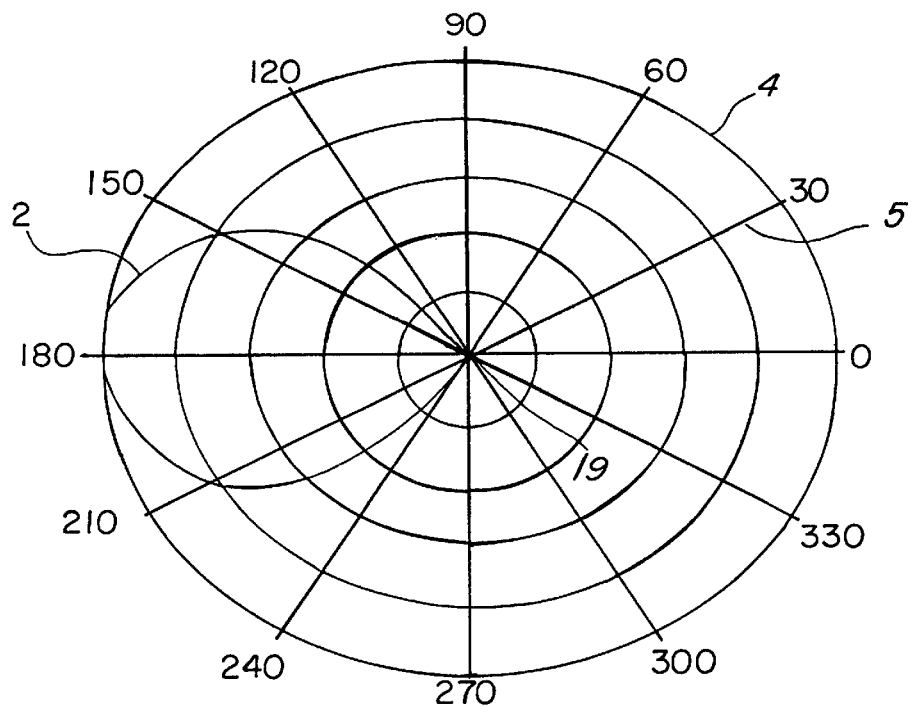
FIG. 2 is a graph of a calculated mask shape generated according to the present invention.

Once the functional form of the mask is known, the shape 2 of the mask can be graphed as shown in FIG. 2. The graph of the mask shape is superimposed on a circle 4 representing the area of a platen 7. The circle 4 is divided by radial lines 5 representing different angular positions with respect to the platen axis 19. The angular widths and edge slopes of the mask segments 25, 26 and 27 in FIG. 4 are adjusted to match the shape 2 (FIG. 2). Note that only a portion of the shape 2 in FIG. 2 is used to generate the mask in FIG. 4. This is because the mask in FIG. 4 only needs to provide flux blockage for the three rows 15, 16 and 18 of mirrors 10 on the platen 7.

The angular width of the mask is constrained by the width of the arm 30 holding the angular segments 25, 26 and 27 in place. This is because the angular width of the mask can not be smaller than the width of the arm 30. Otherwise, the profile of the arm, instead of the mask, will determine the flux blockage. Therefore, when generating the mask, the angular width should not be made smaller than the width of the arm 30.

Figure 3:
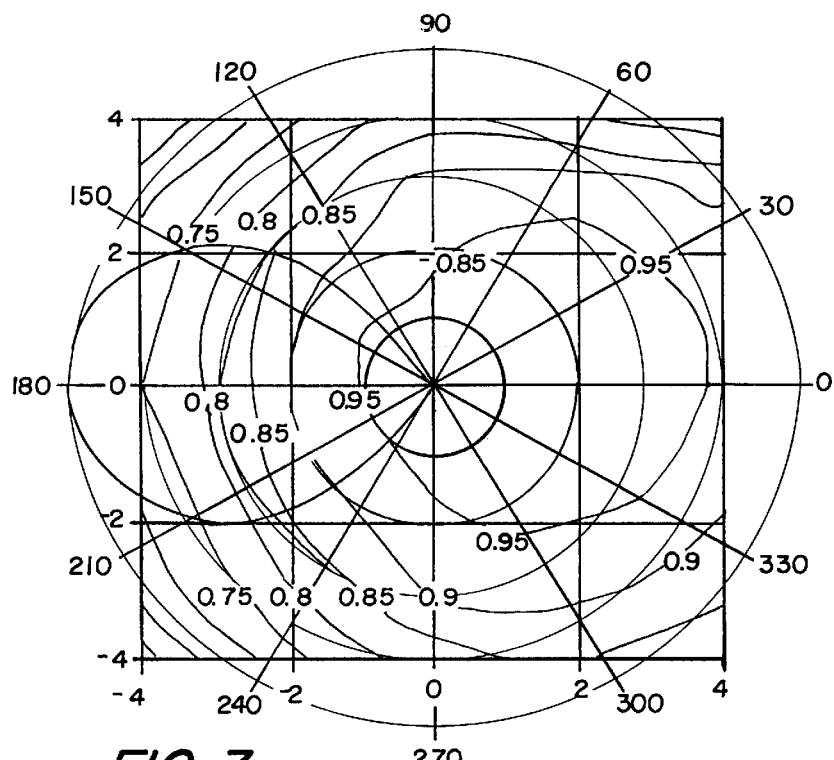
FIG. 3 is a graph of the mask shape of FIG. 2 superimposed over the flux pattern of FIG. 1.

Preferably, the mask is positioned over a low flux area of the platen as shown in FIG. 3. This is because the coating rate is less sensitive to changes in the shape of the mask over a low flux area compared to a high flux area. This makes it easier to adjust the angular segments 25, 26 and 27 to achieve a desired uniform coating rate. Remember that the low flux area corresponds to the low coating thickness area on the mapping of the coating thickness in FIG. 1.

Those skilled in the art will appreciate that various adaptations and modifications of the just-described preferred embodiment of the invention can be configured without departing from the scope and spirit of the invention. For example, even though a symmetrical mask was described, one skilled in the art will appreciate that an asymmetrical mask can also be used. In addition, even though the mask was described as comprising several angular segments, one skilled in the art will appreciated that the mask can be a single piece. Therefore, it is to be understood that, within the scope of the appended claims, the invention may be practiced other than as specifically described herein.

What is claimed is:

1. A method for determining a flux mask shape for use in uniform optical coating of a plurality of mirrors by ion beam sputtering; said plurality of mirrors deposited in circumferential rows on a platen, the steps of the method comprising:

creating a map of coating thickness as a function of position on the platen by covering the platen with a stationary plate and applying a test coating for a predetermined coating time to the stationary plate;

determining coating rate as a function of position on the platen by dividing the map of coating thickness by the coating time; and, shaping the flux mask, said mask comprising a plurality of mask segments attached to an arm and aligned along and above the circumferential rows of mirrors, by selecting an angular width for each mask segment along a radial line of the platen which provides a uniform coating rate along the platen radius.

2. The method of claim 1 wherein the step of creating a map further comprises measuring the test coating with an ellipsometer.

3. The method of claim 1 wherein the step of shaping the flux mask further comprises determining an edge slope for each mask segment.

4. The method of claim 1 wherein the arm of the flux mask has a width and the angular width of a mask segment is greater than the width of the arm.

5. The method of claim 1 further comprising the step of positioning the flux mask over a low flux area of the platen.

* * * * *